(12) United States Patent
Lee

(10) Patent No.: US 6,192,005 B1
(45) Date of Patent: Feb. 20, 2001

(54) CLOCK CONTROL SIGNAL AND OUTPUT ENABLE SIGNAL GENERATOR IN SEMICONDUCTOR MEMORY DEVICE

(75) Inventor: Young-Dae Lee, Seoul (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/594,354

(22) Filed: Jun. 14, 2000

(30) Foreign Application Priority Data

Jun. 16, 1999 (KR) ................................................. 99-22500

(51) Int. Cl.[7] ...................................................... G11C 8/00
(52) U.S. Cl. ...................... 365/233; 365/189.05; 365/191
(58) Field of Search ............................... 365/233, 189.05, 365/191, 195, 196; 327/291, 299

(56) References Cited

U.S. PATENT DOCUMENTS

| | | | |
|---|---|---|---|
| 5,440,514 | * | 8/1995 | Flannagan et al. .................... 365/194 |
| 5,920,511 | * | 7/1999 | Lee et al. .......................... 365/189.05 |
| 5,923,595 | * | 7/1999 | Kim ................................. 365/189.05 |
| 5,963,483 | * | 10/1999 | Yahata et al. ..................... 365/189.05 |
| 6,005,825 | * | 12/1999 | Lee et al. ............................. 365/233 |

* cited by examiner

Primary Examiner—Son Mai
(74) Attorney, Agent, or Firm—Marger Johnson & McCollom, P.C.

(57) ABSTRACT

A clock control signal and an output enable signal generating circuit of a semiconductor memory device includes a first control signal and clock control signal generating circuit, a second control signal generating circuit a write pass through signal generating circuit for generating a write pass through signal in the read command cycle in case write and read commands are sequentially input in a pipeline operation, a third control signal generating circuit for generating a third control signal for detecting a shift from a low impedance of low level to a high impedance of high level in an operation of double cycle deselect function, and for generating the third control signal in a deselect or write command cycle when read, deselect commands or read, write commands are sequentially input in an operation of single cycle deselect function; and an output enable signal generating circuit to generating an output enable signal in response to an output enable control signal in a flow through operation, for generating the output enable signal of high level in response to the second control signal and a signal inverted from the first control signal and for generating the output enable signal of low level in response to the third control signal or the second control signal in a pipeline operation.

12 Claims, 9 Drawing Sheets

CLOCK CONTROL SIGNAL AND OUTPUT ENABLE SIGNAL GENERATOR IN SEMICONDUCTOR MEMORY DEVICE

CROSS REFERENCE TO RELATED APPLICATIONS

This application claims priority from Korean Priority Document No. 99-22500, filed on Jun. 16, 1999 with the Korean Industrial Property Office, which document is hereby incorporated by reference.

BACKGROUND OF THE INVENTION

1. Field of the Invention

The present invention relates to a semiconductor memory device. Particularly, the present invention relates to a clock control signal and output enable signal generator of semiconductor memory device in which a signal generating channel for controlling a low impedance of an output signal is different from that for controlling a high impedance, thereby improving an output enable signal generating speed, and at the same time supporting double cycle deselect, single cycle deselect and write pass through functions, both in a flow through operation and a pipe line read mode.

2. Description of the Prior Art

In a clock control signal and output enable signal generator of a conventional semiconductor memory device, an output enable signal shift is delayed. That is because a signal generating channel for controlling a low impedance in an output signal is identical to that for controlling a high impedance. Therefore, there has been a problem in that, when an output signal of the semiconductor memory device is shifted from a low impedance to a high impedance and from a high impedance to a low impedance, the shift speed is delayed.

This problem has been addressed by making the signal generating channel for controlling a low impedance different from the signal generating channel for controlling a high impedance. But a pipelined read operation of the semiconductor memory device includes single cycle deselect, double cycle deselect and write pass through functions. A problem is that all the single cycle deselect, double cycle deselect and write pass through functions cannot be supported (backed-up) with such different channels.

SUMMARY OF THE INVENTION

Accordingly, the present invention is provided to solve the aforementioned problem. It is an object of the present invention to provide a clock control signal and output enable signal generator in a semiconductor memory device, which can improve the speed in generating an output enable signal, while at the same time supporting all the single cycle, double cycle deselect and write pass through functions. The invention accomplishes this by making the signal generating channel for controlling a high impedance of an Output signal different from the signal generating chairmen for controlling a low impedance.

In accordance with the objects of the present invention, a clock control signal and output enable signal generator is made for a semiconductor memory device having a plurality of first registers for storing a plurality of data output signals, a plurality of second registers for storing the output signals of the first registers in response to a clock control signal, and a plurality of logic gates and output drivers for outputting the output signals of the plurality of second registers in response to an output enable signal.

The generator of the invention comprises a first control signal and clock control signal generating means for generating a first control signal and a clock control signal, which are for controlling a shift of a high impedance to a low impedance after 1 cycle of a read command in a pipelined operation, and for generating a high level of clock control signal in a flow through operation. The invention also includes second control signal generating means for generating a low level of second control signal in a flow through operation, and generating the second control signal for controlling a shift from a low impedance to a high impedance ill a following cycle after read, deselect commands or read, write commands are sequentially input in a pipeline operation. It also includes a write pass through signal generating means for generating a write pass through signal in the read command cycle, in case write and read commands are sequentially input in a pipeline operation. Additionally, it includes a third control signal generating means for generating a third control signal for detecting a shift from a low impedance of low level to a high impedance of high level in an operation of double cycle deselect function, and for generating the third control signal in a deselect or write command cycle when read, deselect commands or read, write commands are sequentially input in an operation of single cycle deselect function. The invention moreover includes an output enable signal generating means for generating an output enable signal in response to an output enable control signal in a flow through operation, for generating the output enable signal of high level in response to the second control signal and a signal inverted from the first control signal, and for generating the output enable signal of low level in response to the third control signal or the second control signal in a pipeline operation.

BRIEF DESCRIPTION OF THE DRAWINGS

For fuller understanding of the nature and object of the invention, reference will be made in the following detailed description taken in conjunction with the accompanying drawings in which.

DETAILED DESCRIPTION OF THE PREFERRED EMBODIMENTS

Figure 1:
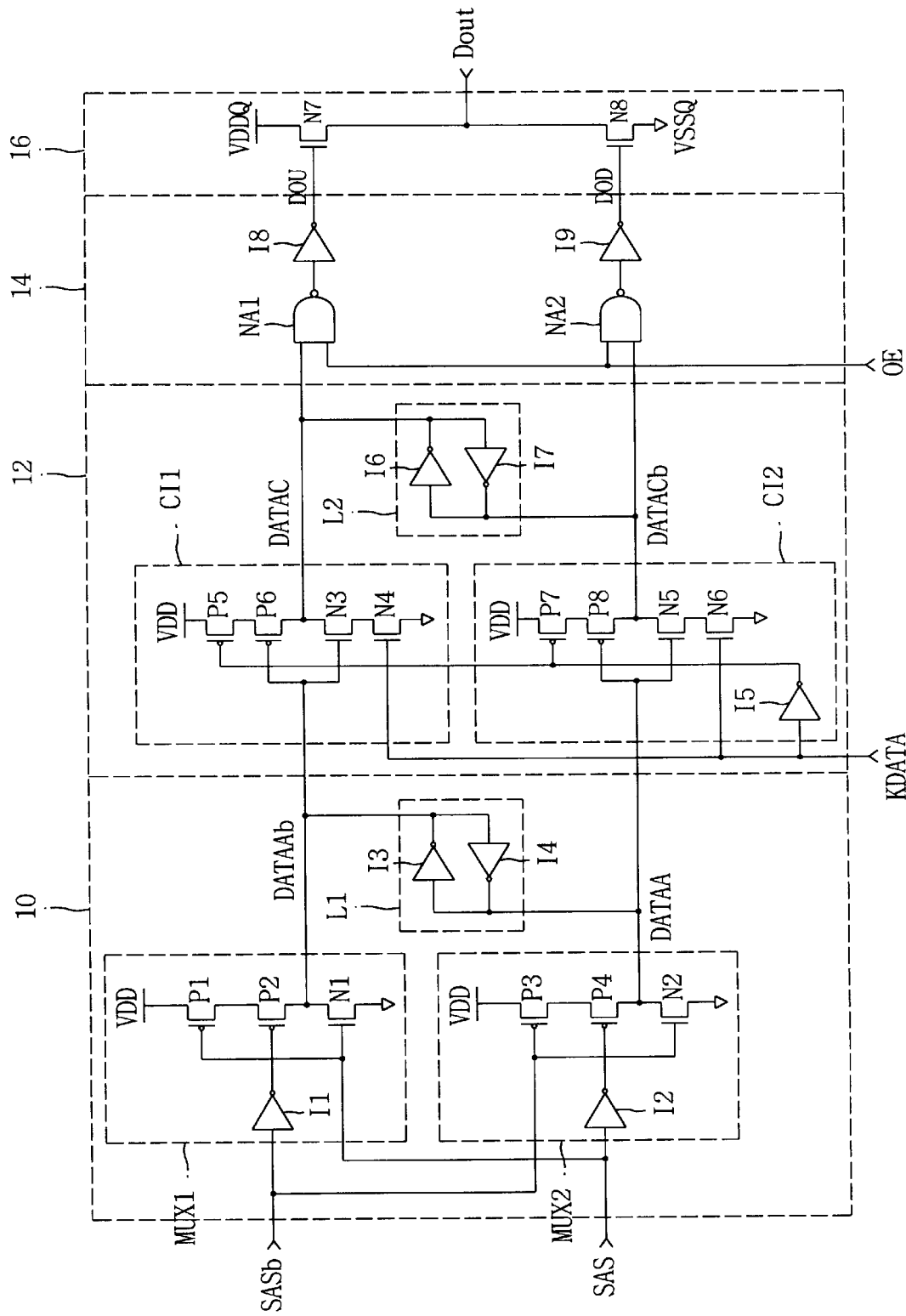
FIG. 1 is a circuit diagram showing a data output buffer of a general semiconductor memory device in the prior art.

Prior to an illustration of the clock control signal and output enable signal generator of the present invention, a general data output buffer and a clock control signal and output enable signal generator in a conventional semiconductor memory device will be explained with reference to the accompanying drawings. Throughout the drawings, like reference numerals and nomenclature are used for designation of like or equivalent parts or portion, for simplicity of illustration and explanation.

FIG. 1 is a circuit diagram of a data output buffer of the conventional semiconductor memory device. It includes first and second registers 10, 12, an ANDing means 14, and an output driver 16.

The first register 10 comprises multiplexers MUX1, MUX2, and latch L1. The second register 12 includes clocked CMOS inverters CI1, CI2 and latch L2. The ANDing means 14 includes NAND gates NA1, NA2 and inverters I8, I9. The output driver 16 consists of NMOS transistors N7, N8.

The operation of the circuit shown in FIG. 1 will be explained in the following.

The register 10 receives a pair of complementary output signals SASb, SAS from a sense amplifier, and generates a pair of data output signals DATAAb, DATAA to latch it. The multiplexers MUX1, MUX2 allow the PMOS transistors P1, P2 and NMOS transistor N2 to be turned-on in response to the sense output signal pair SASb, SAS of high level and low level, respectively, to thereby generate the data output signal pair DATAAb, DATAA of high level and low level, respectively. The latch allows the inverters I3, I4 to latch the data output signal pair, thereafter inverting the data output signal pair DATAAb, DATAA to output as the data output signal pair DATAA, DATAAb.

In the clocked CMOS inverters CI1, CI2, the PMOS transistors P5, P7 and NMOS transistors N4, N6 are turned-on in response to the clock control signal KDATA of high level, then the PMOS transistor P6 and NMOS transistor N3 invert the inversion data output signal DATAAb to generate it as a data output signal DATAC, and the PMOS transistor P8 and NMOS transistor N5 invert the data output signal DATAA to generate it as an inversion data output signal DATACb.

The NAND gate NA1 and inverter I8 serve to change the data output signal DATAC to a data output signal DOU in response to a high level of output enable signal OE. Similarly, the NAND gate NA2 and inverter I9 generate the inversion data output signal DATACb as a data output signal DOD in response to a high level of Output enable signal OE.

The NMOS transistor N7 generates a high level of data output signal Dout in response to a high level of output signal DOU, and the NMOS transistor N8 generates a low level of data output signal Dout in response to a high level of output signal DOD. That is, the data output signal Dout is provided in a state of low impedance. And, when the output enable signal OE is a low level, all the output signal pair DOU, DOD are changed into low levels and the NMOS transistor N7, N8 in the output driver 16 are turned off. This causes the data output signal Dout becomes a state of high impedance.

As stated in the above, the conventional data buffer needs a circuit for generating the clock control signal KDATA and output enable signal OE, both for flow through and pipeline operations. The clock control signal KDATA should be normally at a high state in a flow through operation.

Figure 2:
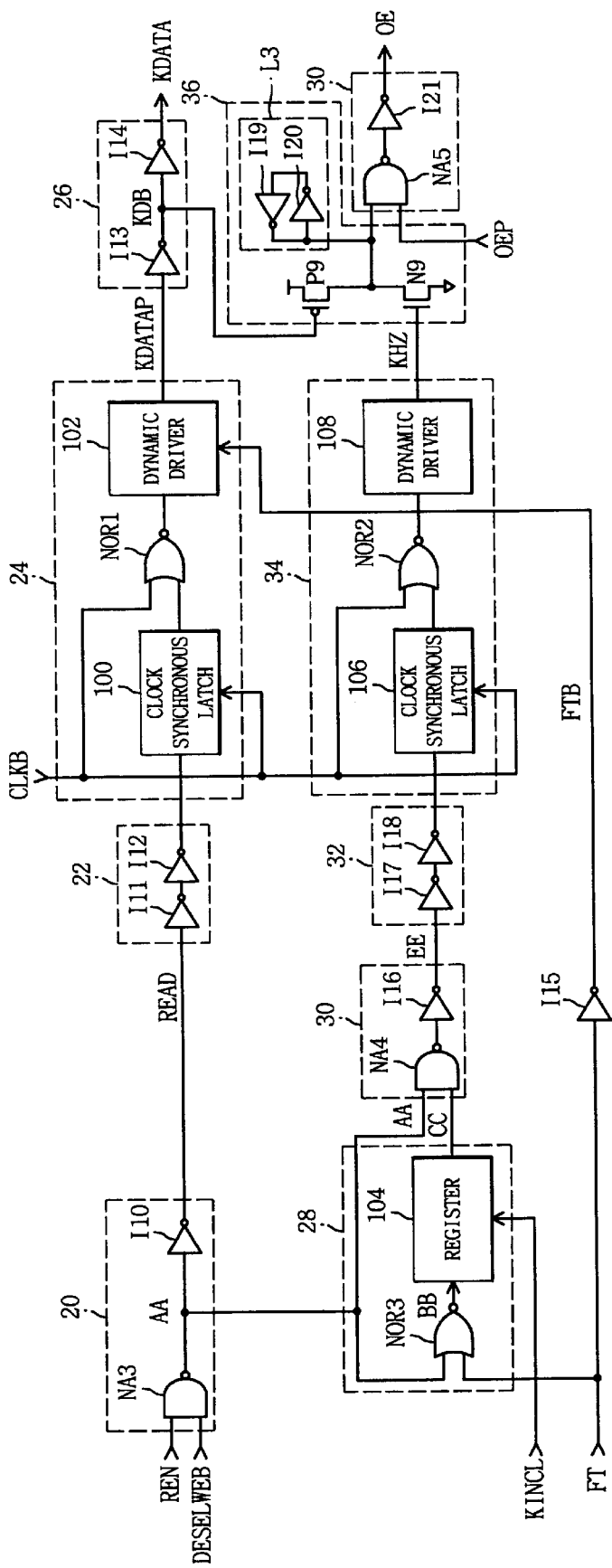
FIG. 2 is a circuit diagram illustrating an embodiment of a clock control signal and output enable signal generator of a conventional semiconductor memory device.

FIG. 2 is a circuit diagram illustrating the clock control signal and output enable signal generating mechanism in accordance with a conventional semiconductor memory device, which designates the clock control signal and output enable signal generating circuit when double cycle deselect operation is performed.

First, the generation of signals as shown in FIG. 2 is explained as follows.

The read enable signal REN is enabled in a high level when the inversion write enable signal is in a high level state.

The deselect inversion enable signal DESELWEB is in a low level when the inversion chip select signal is in a low level, or when one of the chip select signals is in a state of deselect function. The deselect inversion enable signal DESELWEB is a high level when the inversion chip select signal is in a high level, or when all the chip select signals are in a select function.

The clock signal KINCL is synchronized a clock signal XCK that is applied externally, and generated by an internal clock signal generating circuit. The inversion clock signal CLKB is a signal that is inverted internally, in response to an input of the external clock signal XCK.

The output enable signal OE is generated, in a flow through function, by buffering an output enable signal inputted from the external in response to the flow through signal FT of high level and the read command signal READ of high level, and is fixed as a signal of high level in a pipeline function.

Next, the function and stricture of the circuit as shown in FIG. 2 is explained as follows. The AND gate 20 consists of a NAND gate NA3 and an inverter I10. The NAND gate NA3 generates a signal AA by NANDing the signal DESELWEB, which has been generated by the read enable signal REN and chip select signal. The inverter I10 inverts the signal AA to generate the read signal READ.

The delay circuit 22 consists of two inverters I11 land I12, which are connected in series to delay the read signal READ. The circuit 24 for generating the read signal KDATAP includes a clock synchronous latch 100, a NOR gate NOR1 and a dynamic driver 102. The clock synchronous latch 100 inverts and latches an output signal of the delay circuit 22, in response to the inversion clock signal CLKB of high level. The NOR gate NOR1 inverts and outputs an output signal of the clock synchronous latch 100, in response to the inversion clock signal of low level. The dynamic driver 102, in a 1 pipeline function, generates a pulse type of signal KDATAP.

Signal KDATAP is reset as a low level in a predetermined time after being shifted to a high level, when the output signal of the NOR gate is shifted to a high level in response to the inversion flow through signal FTB of high level. In a flow through function, the driver 102 generates the static signal KDATAP of high level, in response to the inversion flow through signal FTB of low level.

The delay circuit 26 consists of two inverters I13, I14 which are connected in series, thereby delaying the signal KDATAP to generate the clock control signal KDATA. The inverter I13 inverts the signal KDATAP to generate the signal KDB.

The delay circuit 28 for delaying 1 cycle consists of a NOR gate NOR3 and a register 104. The NOR gate NOR3 in a flow through operation generates a low level of signal BB, in response to the flow through signal FT of high level. In a pipeline operation, the NOR gate NOR3 inverts the output signal AA of the NAND gate NA3 in response to the flow through signal FT of low level. The register 104 delays the output signal BB of the NOR gate NOR3 by 1 cycle, to generate a signal CC in response to the clock signal KINCL.

The AND gate 30 ANDs the output signal AA of the NAND gate NA3 and the output signal CC of the register 104 to thereby generate a signal EE.

That is, the circuits 28, 30 generate the signal EE, which is enabled as a high level, when a read command is applied in a prior cycle and a deselect or write command is applied in a current cycle.

The circuit 32 is for delaying signal EE. It includes inverters I17, I18.

The circuit 34 is for generating a signal KHZ for controlling a shift to a high impedance. The circuit 34 consists of a clock synchronous latch 106, a NOR gate NOR2 and a dynamic driver 108. The clock synchronous latch 106 inverts and latches the output signal of the delay circuit 32, in response to the inversion clock signal CLKB of high level. The NOR gate NOR2 inverts the output signal of the clock synchronous latch 106, to thereafter output it in response to the inversion clock signal low level. The dynamic driver 108 generates a signal KHZ that is reset as a low level in a predetermined time after being shifted to a high level, when the output signal of the NOR gate NOR2 is shifted to a high level.

The drive circuit 36 includes a PMOS transistor P9, an NMOS transistor N9 and a latch L3 having inverters I19, I20. The PMOS transistor P9 outputs a high level of signal in response to a signal KDB of low level, and the NMOS transistor N9 outputs a low level signal in response to the signal KHZ being of high level. The latch L3 latches the output signals of the PMOS and NMOS transistors P9, N9. The PMOS and NMOS transistors respectively output a latched data, when both are turned-off, in response to the signal KDB of high level and signal KHZ of low level.

The AND gate 30 having a NAND gate NA5 and an inverter I21 generates the output signal of the drive circuit 36, as an output enable signal OE in response to an output enable signal OEP of high level.

That is, the circuits 20, 22, 24, 26 are signal generating circuits for controlling an output signal being shifted to a low impedance, and the circuits 28, 30, 32, 34 are signal generating circuits for controlling an output signal being shifted to a high impedance.

Figure 3:
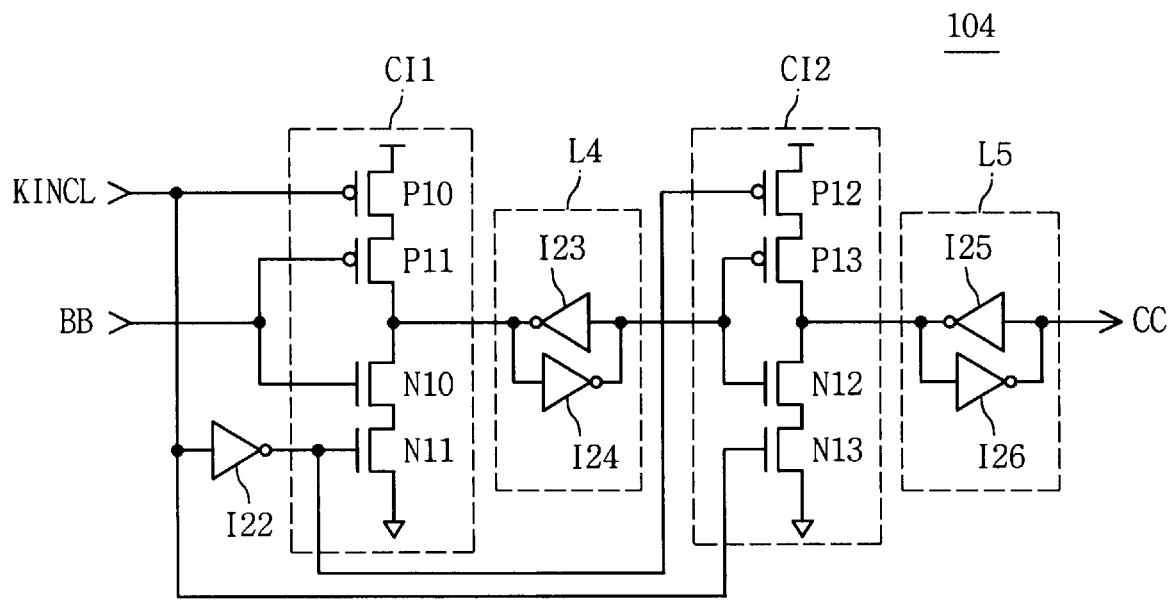
FIG. 3 is a circuit diagram illustrating the structure of a register of the circuit shown in FIG. 2.

FIG. 3 is a circuit diagram illustrating the structure of the register 104 shown in FIG. 2. The register 104 comprises an inverter I22, clocked CMOS inverters CI1, CI2, and latches L4, L5 having inverters I23, I24 and inverters I25, I26.

The structure and function of the circuit of FIG. 3 will be explained as follows.

The clock CMOS inverter CI1 consists of PMOS transistors P10, P11 and NMOS transistors N10, N11. As such it generates a high level of signal when the PMOS transistor P10 and NMOS transistor N11 are turned-on in response to the clock signal KINCL of low level and the PMOS transistor P11 is turned-on in response to the input signal BB of low level. The inverter CI1 generates a low level of signal when the NMOS transistor N10 is turned-on, in response to the input signal BB of high level. The latch L4 having inverters I23, I24 inverts and latches the output signal of the clocked CMOS inverter CI1. The clocked CMOS inverter CI2 has PMOS transistors P12, P13 and NMOS transistors N12, N13. As such, it inverts and outputs the output signal of the latch L4 in response to the clock signal KINCL of high level. The latch L5 having inverters I25, I26 inverts and latches the output signal of the clocked CMOS inverter CI2, thereby generating an output signal CC.

That is, the circuit shown in FIG. 3 delays the input signal BB by 1 cycle, in response to the clock signal KINCL, to thereby generate the output signal CC.

Figure 4:
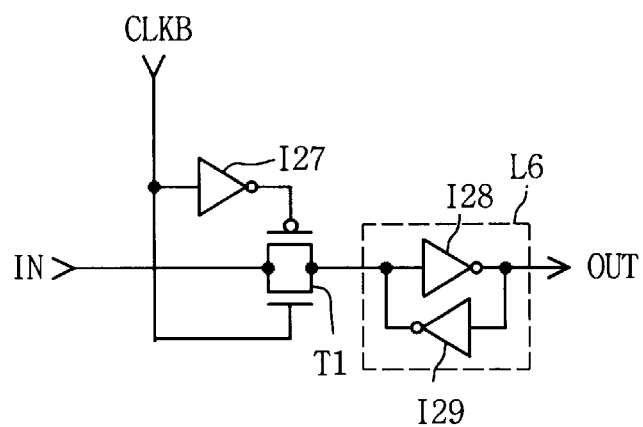
FIG. 4 is a circuit diagram showing the stricture of a clock synchronous latch shown in FIG. 2.

FIG. 4 is a circuit diagram showing the structure of the clock synchronous latches 100, 106. The circuit includes an inverter I27, a CMOS transmission gate T1 and a latch L6 having inverters I28, I29.

The function of the circuit of FIG. 4 is now described as follows.

The CMOS transmission gate T1 is turned-on in response to the inversion clock signal CLKB of high level. This transmits the input signal IN. The latch L6 inverts and latches the output signal of the CMOS transmission gate T1 to generate the output signal OUT. That is, the circuit as shown in FIG. 4 inverts and outputs the input signal IN in response to the inversion clock signal CLKB of high level, and outputs a signal latched by the latch L6 while the inversion clock signal CLKB is at a low level.

Figure 5:
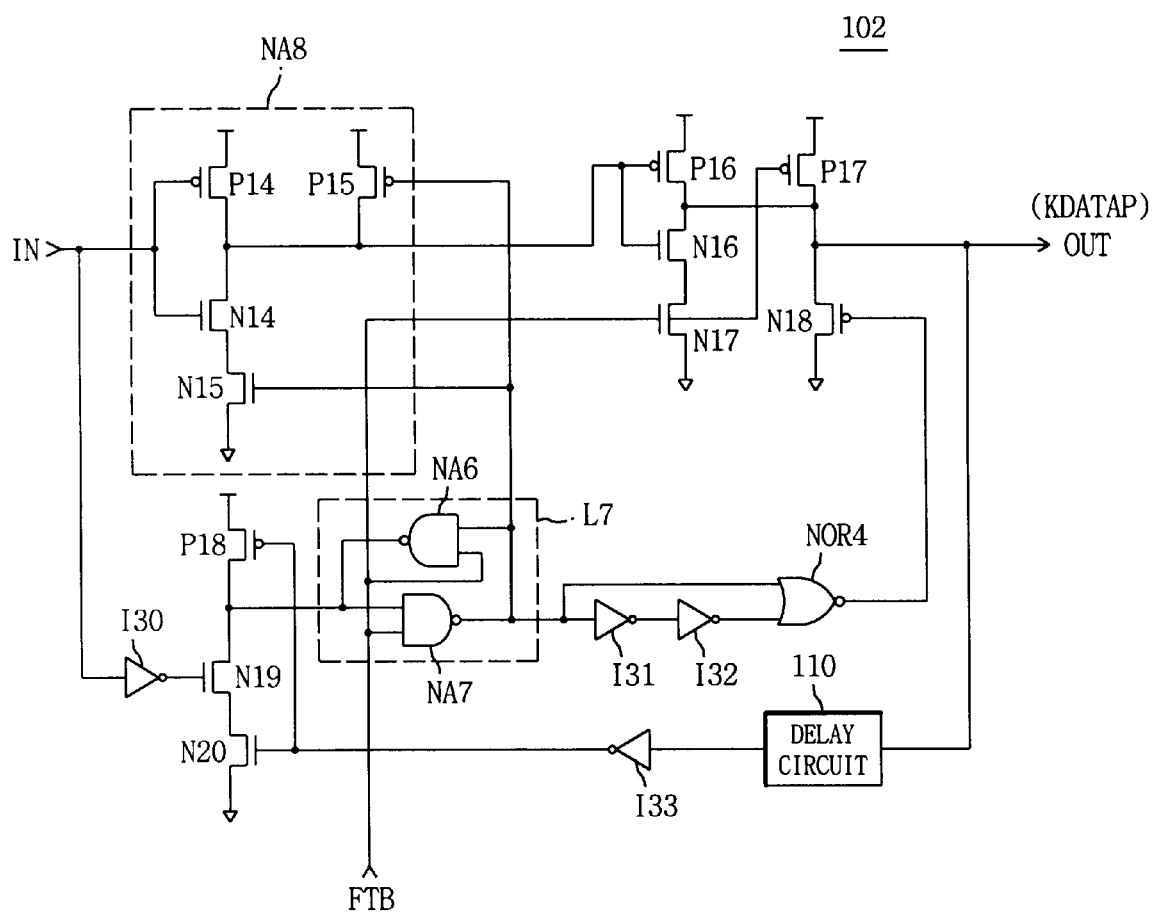
FIG. 5 is a circuit diagram for illustrating the structure of a dynamic driver shown in FIG. 2.

FIG. 5 is a circuit diagram showing the structure of the dynamic driver 102 as shown in FIG. 2. The circuit comprises a NAND gate NA8 having transistors P14, P15, PMOS transistors P16, P17, P18, NMOS transistors N16, N17, N18, N19, N20, inverters I30, I31, I32, I33, a latch L7 having NAND gates NA6, NA7, and a NOR gate NOR 4.

The function of the circuit as shown in FIG. 5 is now described as follows.

The NAND gate NA8 generates a signal of high level when either one of input signals IN and an output signal of the latch L7 are of low level. In the circuit having PMOS transistor P16 and NMOS transistors N16, N17, the NMOS transistor N17, in a flow through operation, is turned-off and disabled in response to the inversion flow through signal FTB of low level outputted from the inverter I15. The NMOS transistor N17, in a pipeline operation, is turned-on and enabled in response to the inversion flow through signal of high level, thereby inverting and outputting the output signal of the NAND gate NA8. The PMOS transistor P17 outputs a high of signal OUT in response to the inversion flow through signal FTB of low level. The delay circuit I10 controls a pulse width of the signal KDATAP or KHZ outputted from the output terminal OUT. The inverter I30 inverts the input signal IN and the inverter I33 inverts the output signal of the delay circuit I10. The circuit having the PMOS transistor P18 and NMOS transistors N19, N20 generates a high level signal in response to a low level of the output signal of the inverter I33. It also generates a signal of low level in response to the output signal of low level of the inverters I30, I33. The latch L7 generates a high level signal in response to the inversion flow through signal FTB of low level, and inverts and outputs the output signal of the common node of the PMOS transistor P18 and NMOS transistor N19 in response to the inversion flow through signal FTB of high level. The inverters I31, I32 delay and output the output signal of the latch L7 The NOR gate NOR4 generates the output signal of high level when both the output signals of the latch L7 and the inverter I32 are at a low level. The NMOS transistor N18 is turned-on in response to the output signal of high level of the NOR gate NOR4, and generates the signal OUT of low level.

In the structure as described in the above, the PMOS transistor P16 is constructed large relative to the size of the NMOS transistor N18, thereby being operated in high speed That is, in the dynamic driver as shown in FIG. 5, the PMOS transistor P17, in a flow through operation, is turned-on in response to the inversion flow through signal FTB of low level, and the NMOS transistor N18 is turned-off in response to the output of low level of the circuit including the latch L7, inverters I31, I32 and NOR gate NOR4, thereby generating the signal OUT of high level.

And, in a pipeline operation, if the signal OUT is at a low level, the signal is delayed and inverted by the delay circuit I10 and inverter I33, thereby the driver generates a high level signal. Then, the NMOS transistor N20 is turned-on, thereby the circuit including the PMOS transistor P18 and NMOS transistors N19, N20 is enabled.

At this time, when the input signal IN of low level is applied, the NMOS transistor N19 is turned-on to generate a low level signal, and the latch L7 inverts and latches a low level signal to generate a high level signal. And, the circuit having inverters I31, I32 and NOR gate NOR 4 NANDs signals of high level to generate a low level signal. In addition, when the input signal IN of low level is applied, the PMOS transistor P14 is tuned-on, and the NAND gate NA8 accordingly generates an output signal of high level. And the NMOS transistor N16 is turned-on in response to an output signal high level, to generate the signal OUT of low level.

When the input signal IN of high level is applied, the NMOS transistor N14 is turned-on, and the NAND gate NA8 accordingly generates a low level of signal. And the PMOS transistor P16 is turned-on, thereby generating the signal OUT of high level. At this time, the latch L7 latches a high level signal.

As described in the above, if the signal OUT is shifted to a high level, the delay circuit 110 and inverter I33 serve to delay and invert the signal OUT of high level to generate a low level signal. Then, the PMOS transistor P18 is turned-on to generate a high level signal. The latch L7 inverts and latches a signal of high level to generate a signal of low level. The inverters I31, I32 and NOR gate NOR 4 perform NOR operation with signals of low level, to thereby generate a signal of high level. Then, the NMOS transistor N18 is turned-on, and accordingly generates a signal OUT of low level.

Therefore, in a pipeline operation, the dynamic driver as shown in FIG. 5 generates a signal OUT of low level if an input signal IN of low level is input. And the driver generates a signal OUT shifting to a high level if an input signal IN of high level is input, generating a signal KDATAP being shifted to a low level in a predetermined time after the signal OUT is shifted to a high level.

The dynamic driver 108 is constructed similarly to what is shown in FIG. 5. However, the PMOS transistor P17 and NMOS transistor N17 are removed, and the NAND gates NA6, NA7 are replaced with inverters.

Figure 6:
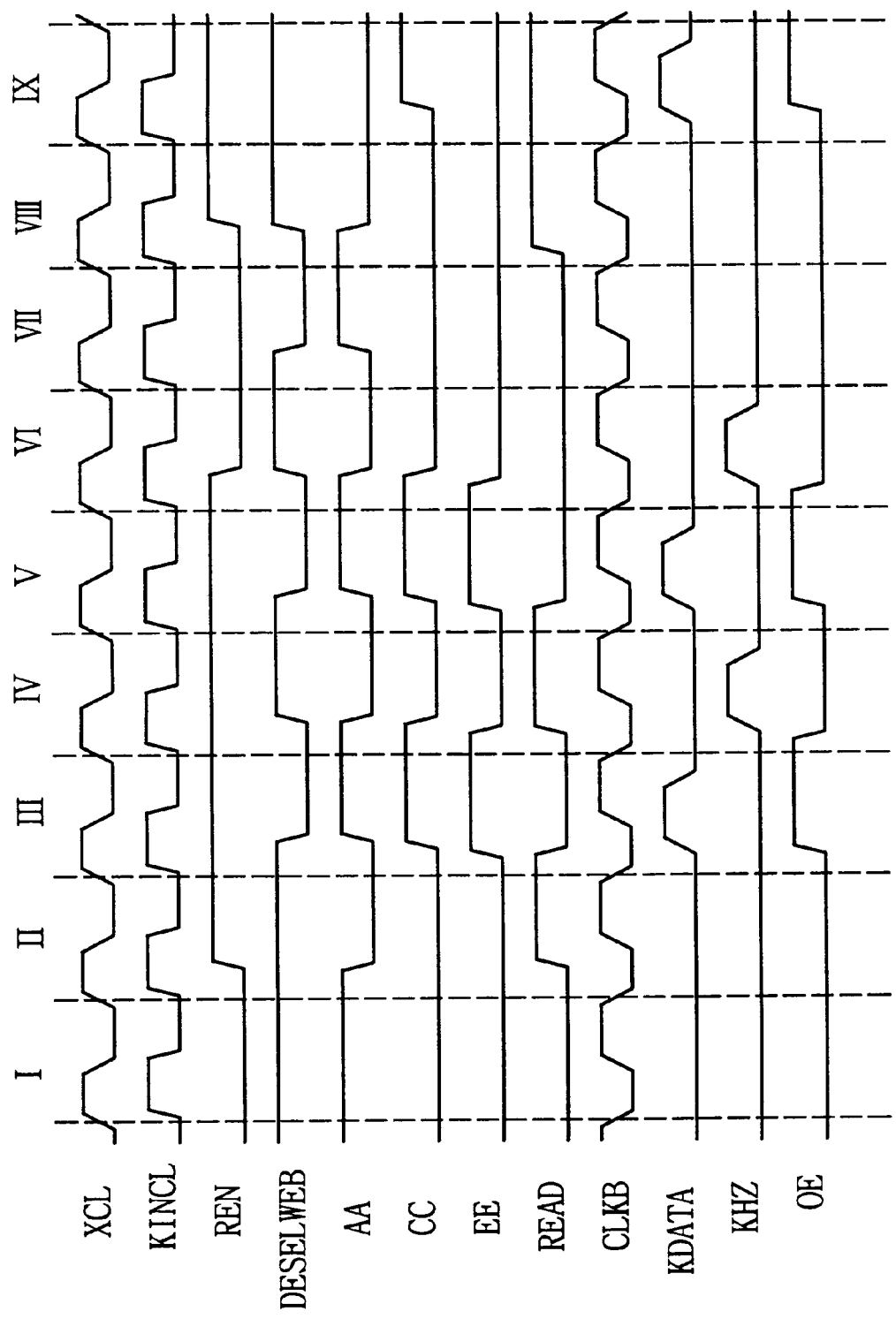
FIG. 6 is a timing diagram for illustrating an operation of the clock control signal and output enable signal generator shown in FIG. 2, in a pipelined mode.

FIG. 6 is a timing diagram illustrating an operation of the clock control signal KDATA and out enable signal OE generating circuit in a pipeline mode.

The operation in a flow through mode will be easily understood referring to the above-mentioned explanation. In this flow through operation, the clock control signal KDATA and output enable signal OE are fixed as high level, as described above. That is, in the flow through operation, the signal FTB of low level is input to the dynamic driver 102, thereby the output signal KDATAP is maintained as a high level, as can be verified from FIG. 5. The clock control signal KDATA of high level is accordingly generated. And, the signal FT of low level is input to the NOR gate NOR3, thereby the signal EE becomes low level and the signal KHZ becomes low level. As a result, in the flow through operation, the output signal of the drive circuit 36 is maintained as high level, thereby the signal OEP is generated as an output enable signal OE. The signal OEP in a flout through operation is a signal being generated as a high level only when a read command is input.

The operation in a pipeline read is now explained with reference to FIG. 6. In the first write command cycle I, when the read enable signal REN of low level and the signal DESELWEB of high level are input, the NAND gate NA3 (in FIG. 2) generates the signal AA of high level and the inverter I10 generates the read signal READ of low level. The delay circuit 22 delays a low level of signal. In the timing diagram in FIG. 6, it is assumed that, since the command in the prior cycle is a write or deselect command, a low level of signal is stored in the register 104. Then, the AND gate 30 generates the signal EE of low level. The delay circuit 32 delays a low level of signal. The signal KDATAP generating circuit 24 generates the signal KDATAP signal of low level in response to the inversion clock signal CLKB of low level, and inverts and latches the output signal of the delay circuit 22 in a low level in response to the inversion clock signal CLKB of high level. The signal KHZ generating circuit 34 generates the signal KHZ of low level in response to the inversion clock signal CLKB of low level, and inverts and latches the output signal of the delay circuit 32 in a low level in response to the inversion clock signal CLKB of high level. The delay circuit 26 delays the signal KDATAP of low level, to generate the clock control signal KDATA of low level. The drive circuit 36 generates a low level of signal that was latched by the latch L3. The AND gate 38 generates the output enable signal OE of low level.

In the second read command cycle II, when the read enable signal REN of high level is input and the signal DESELWEB is of high level, the NAND gate NA3 generates the signal AA of low level and the inverter I10 generates the read signal READ of high level. The delay circuit 22 delays and outputs the read signal READ of high level. The 1 cycle delay circuit 28 generates the signal CC of low level in cycle III. The AND gate 30 generates the signal EE of low level. The delay circuit 32 delays and outputs a low level of signal. The signal KDATAP generating circuit 24 generates the signal KDATAP signal of low level in response to the inversion clock signal CLKB of low level, and inverts and latches the output signal of high level of the delay circuit 22 in response to the inversion clock signal CLKB of high level. The signal KHZ generating circuit 34 generates the signal KHZ of low level in response to the inversion clock signal CLKB of low level, and inverts and latches the output signal of low level of the delay circuit 32 in response to the inversion clock signal CLKB of high level. The delay circuit 26 delays the signal of low level to generate the clock control signal KDATA of low level. The drive circuit 36 generates a low level of signal that was stored by the latch L3. The AND gate 38 generates the output enable signal OE of low level.

That is, when write, read commands are sequentially input, the clock control signal KDATA and output enable signal OE are not generated in the same cycle (i.e., cycle II).

In the third deselect command cycle III, when the read enable signal REN of high level is input and the signal DESELWEB is input of low level, the NAND gate NA3 generates the signal AA of high level, and the inverter I10 generates the read signal READ of low level. The delay circuit 22 delays the read signal READ of low level. The circuit 28 for delaying a prior command by 1 cycle generates the signal CC of high level. The AND gate 30 generates the signal EE of high level. The delay circuit 32 delays a high level of signal. The signal KDATAP generating circuit 24 generates the signal KDATAP signal of high level in response to the inversion clock signal CLKB of low level, and inverts and latches the output signal of low level of the delay circuit 22 in response to the inversion clock signal CLKB of high level. The signal KHZ generating circuit 34 generates the signal KHZ of low level in response to the inversion clock signal CLKB of low level, and inverts and latches the output signal of high level of the delay circuit 32 in response to the inversion clock signal CLKB of high level. The delay circuit 26 delays the signal of high level to generate the clock control signal KDATA of high level. The drive circuit 36 outputs a high level of signal to latch it. The AND gate 38 generates the output enable signal OE of high level.

That is, when read, write commands are sequentially input, the clock control signal KDATA of low level and output enable signal OE of high level are generated.

In the fourth read command cycle IV, like in the second read command cycle, the signals AA, CC, DD are generated. The delay circuit 28 for delaying a prior command by 1 cycle generates the signal CC of low level. The AND gate 30 generates the signal EE of low level. The delay circuit 22 delays the signal READ, the delay circuit 32 delays the signal EE. The signal KDATAP generating circuit 24 generates the signal KDATAP signal of low level in response to the inversion clock signal CLKB of low level, and inverts and latches the read signal READ of high level in response to the inversion clock signal CLKB of high level. The signal KHZ generating circuit 34 generates the signal KHZ of high level in response to the inversion clock signal CLKB of low level, and inverts and latches the signal EE of low level in response to the inversion clock signal CLKB of high level. The delay circuit 26 generates the clock control signal KDATA of low level. The drive circuit 36 outputs a low level of signal in response to the signal KHZ of high level. The AND gate 38 generates the output enable signal OE of low level.

That is, when read, deselect commands are sequentially input, the pulse signal KHZ is generated in a next cycle.

The operation in the fifth deselect command cycle V will be easily understood referring to the operation of the third cycle II stated above. That is, the clock control signal KDATA and output enable signal OE in high levels are generated.

The sixth write command cycle VI follows after read and deselect commands are input and the pulse signal KHZ of high level is generated and the output enable signal OE of low level is generated.

The seventh deselect command cycle VII and eighth read commanded cycle VIII allows the signals KDATA, KHZ and output enable signal OE in low levels are generated.

Since the eighth cycle is in a read command, in the ninth cycle IX, the clock control signal KDATA of high level and output enable signal of high level are generated. That is, the double cycle deselect function can be operated in the pipeline read mode by proceeding the above-mentioned operations.

Therefore, in the conventional clock control signal and output enable signal generating circuit of the semiconductor memory device as shown in FIG. 2, the high impedance signal generating route is different from the low impedance signal generating route, which permits to generate an output enable signal at high speed. However, there is a problem that the double cycle deselect function can be performed in a pipeline operation, but the write pass through and single cycle deselect functions cannot be preformed.

Figure 7:
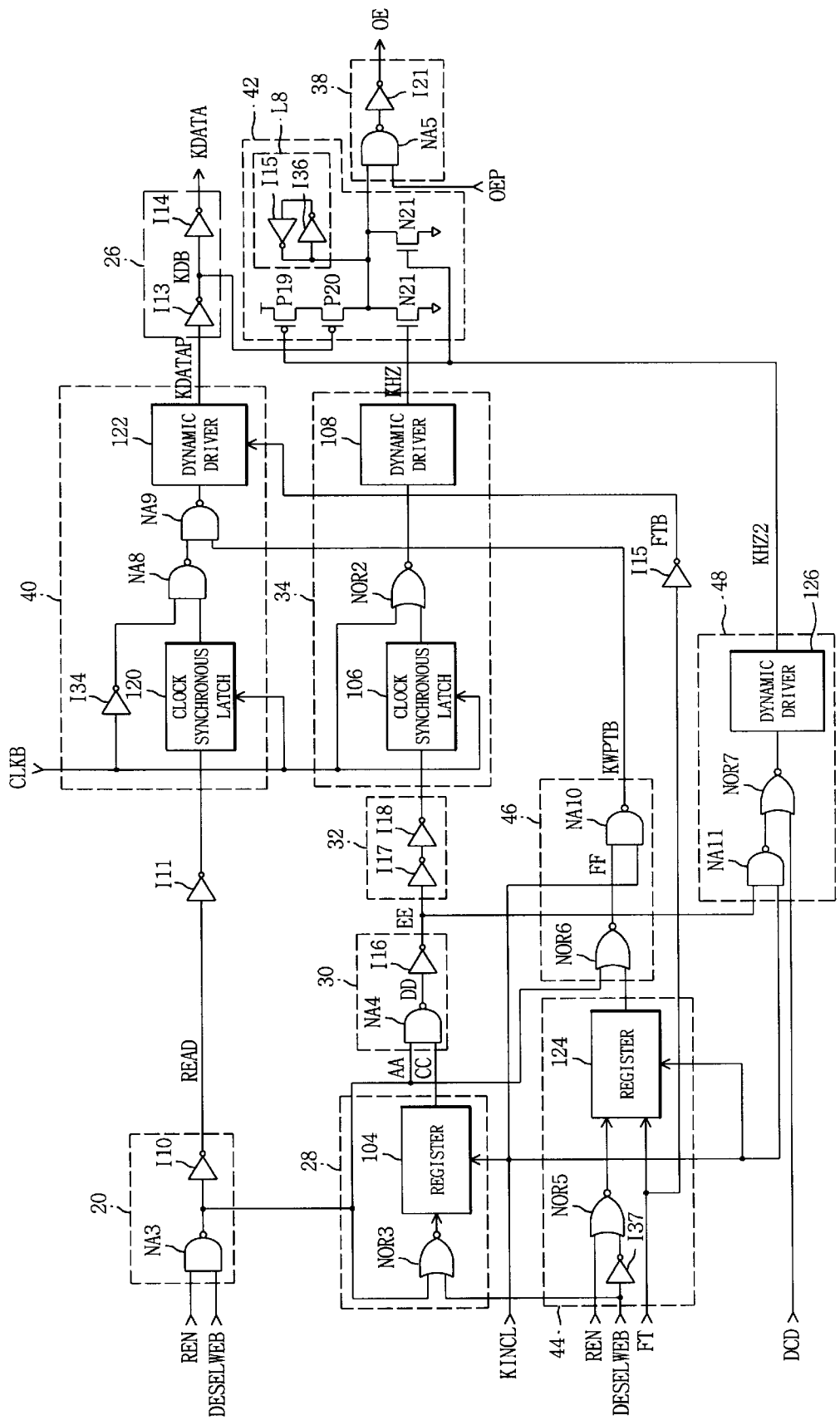
FIG. 7 is a circuit diagram showing a clock control signal and output enable signal generator of a semiconductor memory device in accordance with the present invention.

FIG. 7 is a circuit diagram of a clock control signal and Output enable signal generating circuit made according to the present invention. Taken as a whole, it is superior to that in the prior art. If compared to the circuit of FIG. 2, individual differences can be identified. Notably, the circuit of the invention comprises a signal generating circuit 40 instead of the signal KDATAP generating circuit 24, a drive circuit 42 instead of the drive circuit 36, a novel write command detect and delay circuit 44, a novel write pass through signal generating circuit 46, and a novel signal KHZ2 generating circuit 48. In addition, there are other differences, for example, the inverter I12 is removed.

Notwithstanding their differences, it is advantageous to describe the present invention of FIG. 7 in terms of the circuit of FIG. 2, at last in part. That is why efforts are made to label some of the components of the circuit of FIG. 7 with similar names and numbers as those of FIG. 2, which shortens the description.

The structure and function of the circuit as shown in FIG. 7 is now explained as follows.

The combination of circuits 20, 40, and 26 is also known as a first control signal and clock control signal generating circuit. Circuits 28, 30 and 34 are also collectively known as a second control signal generating circuit. They generate a second control signal KHZ.

The signal KDATAP generating circuit 40 comprises inverter 134, clock synchronous latch 120, NAND gates NA8, NA9 and dynamic driver 122. The clock synchronous latch 120 can be made similarly to what is shown in FIG. 4. It inverts and latches an output signal of the delay circuit 22, in response to the inversion clock signal CLKB of high level. The inverter 134 inverts the inversion clock signal CLKB. The NAND gate NA8 inverts and outputs an output signal of the clock synchronous latch 120 in response to the output signal of high level of the inverter 134. The NAND gate NA9 generates a high level of signal in response to the inversion write pass through signal KWPTB of low level, and inverts and outputs the output signal of the NAND gate NA8 in response to the inversion write pass through signal KWPTB of high level. The dynamic driver 122, in a pipeline function, generates a signal KDATAP which is reset as a low level in a predetermined time after being shifted to a high level, when the output signal of the NOR gate is shifted to a high level in response to the inversion flow through signal FTB of high level (which is output from the inverter I43). And in a flow though function, the driver 122 generates the signal KDATAP of high level in response to the inversion flow through signal FTB of low level.

The drive circuit 42 includes PMOS transistors P19, P20, NMOS transistors N21, N22 and a latch L8 having inverters I35, I36. The PMOS transistors P19, P20 output a high level of signal in response to signals KDB, KHZ2 of low levels, and the NMOS transistors N21, N22 generate a low level signal in response to the signal KHZ of high level or signal KHZ2. The latch L8 latches the output signals of the common node of the PMOS and NMOS transistors P20, N21.

Circuits 44 and 46 are also collectively known as a write pass through generating circuit. This generates a write pass through signal.

The write command detect and delay circuit 44 includes an inverter I37, a NOR gate NOR35 and a register I24. The inverter I37 inverts the signal DESELWEB. The NOR gate NOR5 performs NANDing of the read enable signal REN and the output signal of the inverter I37. That is, the inverter I37 and NOR gate NOR5 detect the write command. The register I24 inverts and delays the output signal of the NOR gate NOR5 by 1 cycle, in response to the flow through signal FT of low level to thereby output it. It also generates a low level of signal in response to the flow through signal FT of high level.

The write pass through signal generating circuit 46 includes a NOR gate NOR6 and a NAND gate NA10. The NOR gate NOR6 performs NORing the output signals of the register 124 and the NAND gate NA3, to thereby generate the output signal FF. That is, the NOR gate NOR6 performs NORing of the output signals of the register 124 and NAND gate NA3 in low levels, thereby generating the output signal FF of high level. The NAND gate NA10 inverts the output signal of the NOR gate in response to the clock signal KINCL of high level, thereby generating the write pass through signal KWPTB.

Circuit 48 is also known as a third control signal generating circuit. It generates a third control signal KHZ2.

The signal KHZ2 generating circuit 48 includes a NAND gate NA11, a NOR gate NOR7, and a dynamic driver 48. The NAND gate NA11 inverts and outputs the signal EE in response to the clock signal KINCL of high level. The NOR gate NOR7 generates a low level of signal in response to the double cycle deselect signal DCD of high level, and inverts and outputs the output signal of the NAND gate NA11 in response to the double cycle deselect signal DCD of high level. The dynamic driver 126 generates a signal KHZ2 of low level, if the output signal of the NOR gate NOR7 is at a low level. And the driver 126 generates the signal KHZ2 being shifted to a low level in a predetermined time alter being shifted to a high level, if the output signal of the NOR gate is at a high level.

Figure 8:
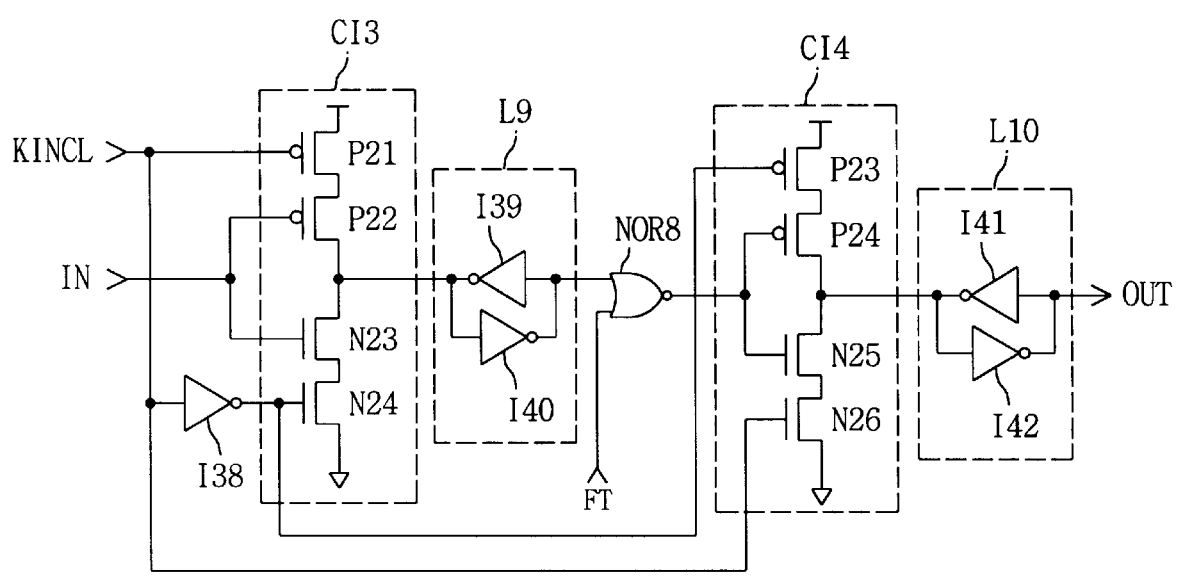
FIG. 8 is a circuit diagram illustrating the structure of a register shown in FIG. 7.

FIG. 8 is a circuit diagram illustrating the structure of the register 124 of the circuit as shown in FIG. 7.

The register includes an inverter I38, clocked CMOS inverters CI3, CI4, latches L9, L10 and a NOR gate NOR8. The clock CMOS inverter CI3 consists of PMOS transistors P21, P22 and NMOS transistors N23, N24. The inverter CI3 generates a high level of signal when the PMOS transistor P21 and NMOS transistor N24 are turned-on in response to the clock signal KINCL of low level, and the PMOS transistor P22 is turned-on in response to the input signal IN of low level. The inverter CI3 generates a low level of signal when the NMOS transistor N23 is turned-on in response to the input signal IN of high level. The latch L9, having inverters I39, I40, inverts and latches the output signal of the clocked CMOS inverter CI3. The NOR gate NOR8, in a flow through operation, generates a low level of signal in response to the flow through signal FT of high level, and in a pipeline operation, inverts and outputs the output signal of the latch L9 in response to the flow through signal FT of low level. The clocked CMOS inverter CI4, having PMOS transistors P23, P24 and NMOS transistors N24, N25, inverts and outputs the output signal of the NOR gate NORS in response to the clock signal KINCL of high level. The latch L10, having inverters I41, I42, inverts and latches the output signal of the clocked CMOS inverter CI4, thereby generating an output signal OUT.

That is, the circuit shown in FIG. 8, in a flow through operation, generates the output signal OUT of low level in response to the flow through signal FT of high level. In a pipeline operation, it delays and inverts the input signal IN by 1 cycle in response to the flow through signal FT of low level, thereby generating the output signal OUT.

Figure 9:
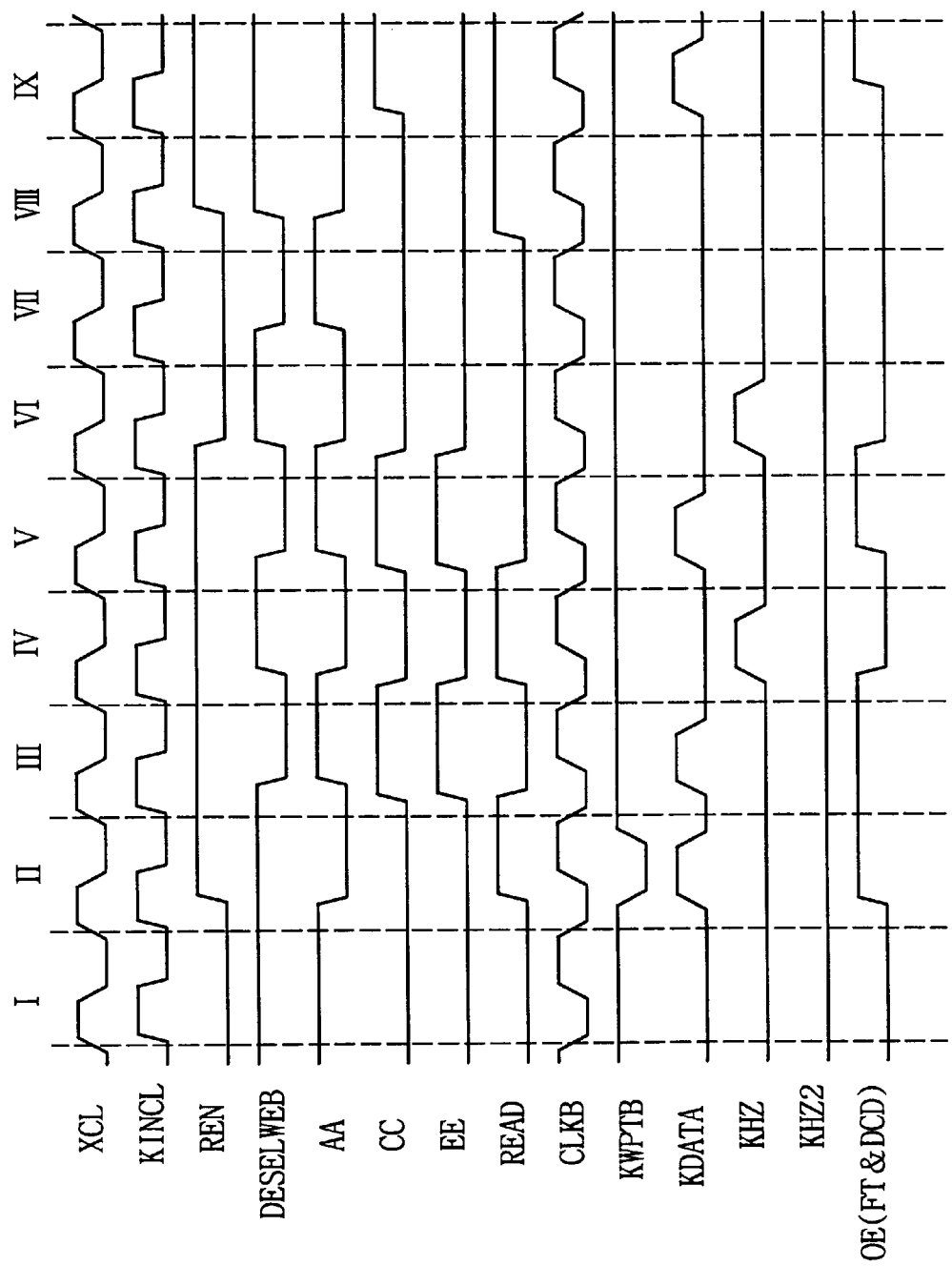
FIG. 9 is a timing diagram for illustrating double cycle deselect and flow thorough operations in a pipelined mode of the clock control signal and output enable signal generator shown in FIG. 7.

FIG. 9 is a timing diagram illustrating the double cycle deselect operation and the flow through operation in a pipeline function of the clock control signal KDATA and output enable signal OE generating circuit shown in FIG. 7.

In this case, the flow through signal FT of high level and the double cycle deselect signal DCD of high level are applied. Then, the signal KHZ2 is fixed as a low level. And the write pass through signal generating circuit 46 generates the inversion write pass through signal KWPTB of low level, in case that the prior command is a write command and the current command is a read command.

Accordingly, the inversion write pass through signal KWPTB of low level is generated in the second read command cycle II, after the first write command cycle I. The NAND gate NA9 generates a high level of signal. The dynamic driver 122 generates a signal KDATAP being shifted to a low level in a predetermined time after being shifted to a high level in response to a high level. The delay circuit 26 delays the signal KDATAP. The signal KHZ is fixed as a low level. The drive circuit 42 generates a high level of signal in response to the output signal of low level of the inverter I13. The AND gate 38 generates the signal OEP of high level as an enable signal OE.

The timing of the signals from the third cycle III to the ninth cycle IX is identical to the timing of the signals shown in FIG. 6.

Accordingly, the clock control signal and output enable signal generating circuit can perform the flow through and double cycle deselect function in a pipelined read mode.

Figure 10:
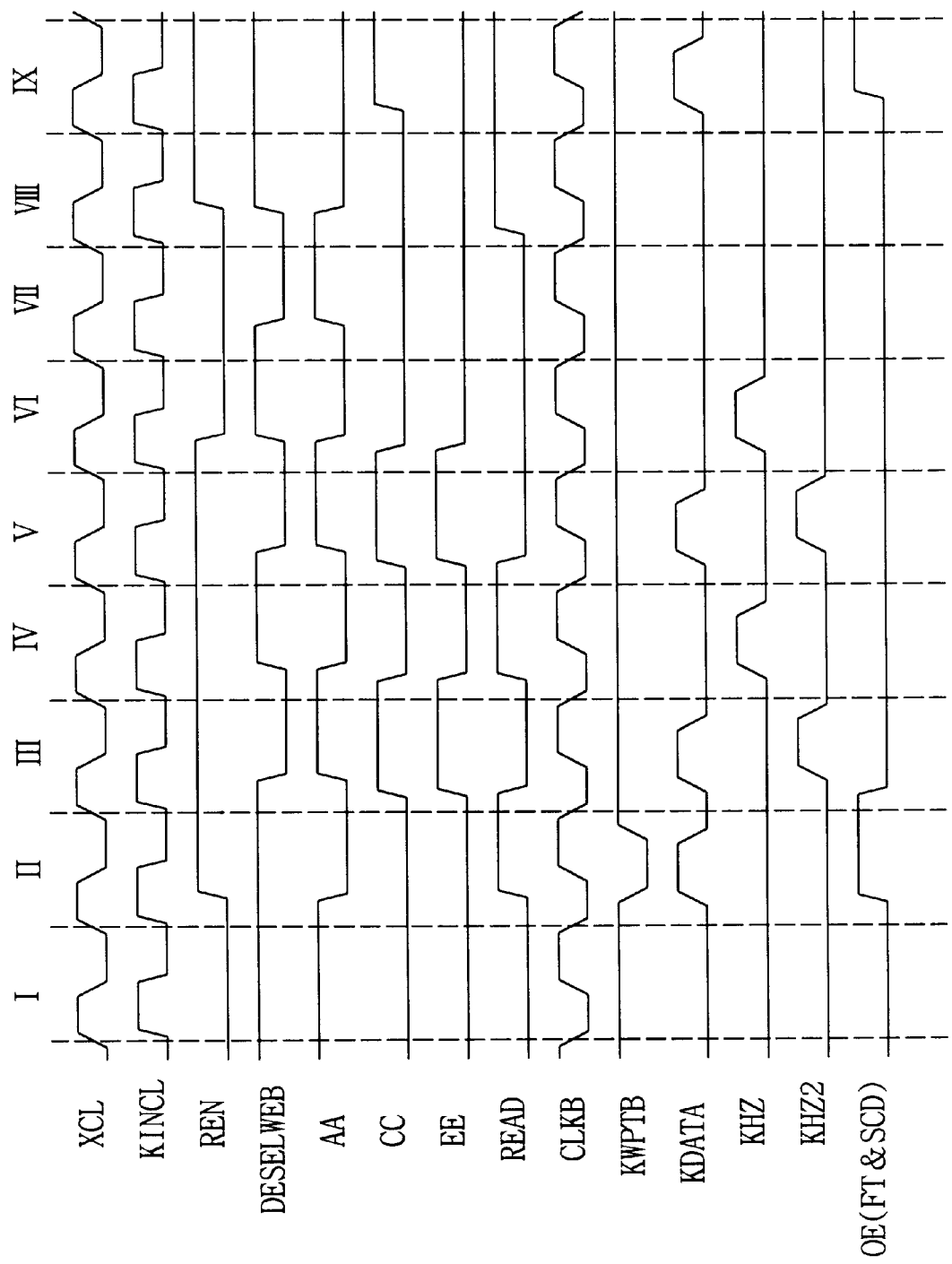
FIG. 10 is a timing diagram for illustrating single cycle deselect and flow through operations in a pipeline mode of the clock control signal and output enable signal generator shown in FIG. 7.

FIG. 10 is a timing view illustrating the write pass through and single cycle deselect operations in a pipeline of the clock control signal KDATA and output enable signal OE generating circuit shown in FIG. 7.

In this case, the flow through signal FT of high level and the double cycle deselect signal DCD of low level are applied. Then, the signal KHZ is fixed as a low level. And the write pass through signal generating circuit 46 generates the inversion write pass through signal KWPTB of low level, in case that the prior command is a write command and the current command is a read command.

Like the timing view as shown in FIG. 9, the circuit as shown in FIG. 7, in the second read command cycle II, generates the inversion write pass through signal KWPTB of low level and the output enable signal OE of high level.

In the third deselect cycle III, since the read command is applied to the second cycle II, the clock control signal KDATA of high level is generated.

The NAND gate NA11 inverts the signal EE of high level to generate a low level of signal, in response to the clock signal KINCL of high level. The NOR gate NOR7 generates a high level. The dynamic driver 126 generates a signal KHZ2 being shifted to a low level in a predetermined time after being shifted to a high level, in response to a high level. The drive circuit 42 allows the PMOS transistor P19 to be turned-off and the NMOS transistor N22 to be turned-on, thereby generating a low level of signal, in response to the signal KHZ2 of high level. The AND gate 38 generates the output enable signal OE of low level.

In the fourth read command cycle IV, the signal KHZ is generated, like in the timing view shown in FIG. 6.

In the fifth deselect command cycle V, the clock control signal KDATA and signal KHZ2 of high level are generated, since a read command is applied to the fourth cycle.

In the sixth write command cycle VI, the signal KHZ of high level is generated. The timings of the signals in the seventh deselect command cycle VII, eighth read command cycle VIII and ninth read command cycle IX are identical to the timing of the signals as shown in FIG. 6.

That is, the clock control signal and output enable signal generating circuit of the invention generates the output enable signal OE in the read command cycle, in case that the write and read commands are sequentially applied, and in the next read command cycle, in case that the read commands are sequentially applied, while the flow through and single cycle deselect functions are performed in a pipeline operation. In this case, when the read, deselect commands are sequentially applied, the signal KHZ2 of high level is generated, so that the output enable signal OE is generated in the deselect command cycle.

Accordingly, as shown in FIG. 7, the clock control signal and output enable signal generating circuit can perform the flow through and single cycle deselect functions in a pipelined read operation.

As described above, according to the semiconductor memory device of the present invention, the clock control signal and output enable signal generating circuit allows the semiconductor memory device to perform the write pass through, double cycle deselect and double cycle deselect functions in the flow through and pipelined read operations.

Accordingly, according to the present invention, the clock control signal and output enable signal generating circuit is constructed in such a way that the high impedance signal generating route and the low impedance signal generating route are different from one another, thereby generating the output enable signal in a high speed.

Also, the signal generating circuit of the present invention allows the semiconductor memory device to perform all the write pass through, single cycle deselect and double cycle deselect functions in the flow through and pipelined read operations.

A person skilled in the art will be able to practice the present invention in view of the present description, where numerous details have been set forth in order to provide a more thorough understanding of the invention. In other instances, well-known features have not been described in detail in order not to obscure unnecessarily the invention. In interpreting this document, words should be accorded a meaning consistent with what is found in common non-technical dictionaries, and also in technical dictionaries for the art of the invention. In addition, the meanings of the words in this document can be augmented from their particular usage in this document, especially where this document expressly gives them a specific meaning.

While the invention has been disclosed in its preferred form, the specific embodiments thereof as disclosed and illustrated herein are not to be considered in a limiting sense. Indeed, it should be readily apparent to those skilled in the art in view of the present description that the invention can be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and sub-combinations of features, functions, elements and/or properties may be presented in this or a related document.

What is claimed is:

1. A clock control signal and output enable signal generating circuit of a semiconductor memory device that comprises a plurality of first registers for storing a plurality of data output signals, a plurality of second registers for storing the output signals of the first registers in response to a clock control signal, and a plurality of logic gates and output drivers for outputting the output signals of the plurality of the second registers in response to an output enable signal, the circuit comprising:

a first control signal and clock control signal generating circuit for generating a first control signal and a clock control signal for controlling a shift from a high impedance to a low impedance after 1 cycle of a read command in a pipelined operation, and for generating a high level of the clock control signal in a flow through operation;

a second control signal generating circuit for generating a second control signal to control a shift from a low impedance to a high impedance in a following cycle after a read command is input sequentially before one of a deselect command and a write command in a pipeline operation, and to generate a low level of the second control signal in a flow through operation;

a write pass through signal generating circuit for generating a write pass through signal in a read command cycle, in case the read command is sequentially input after a write command in a pipeline operation;

a third control signal generating circuit for generating a third control signal for detecting a shift from a low impedance of low level to a high impedance in an operation of double cycle deselect function, and for generating the third control signal in one of a deselect command cycle and a write command cycle when respectively a deselect command and a write command are input sequentially after a read command in an operation of single cycle deselect function; and an output enable signal generating circuit for generating an output enable signal in response to an output enable control signal in a flow through operation, for generating the output enable signal of high level in response to the second control signal and a signal inverted from the first control signal, and for generating the output enable signal of low level in response to one of the second control signal and the third control signal in a pipeline operation.

2. The circuit of claim 1, wherein the first control signal and clock control signal generating circuit comprises:

a read signal generating circuit for ANDing a read enable signal and a deselect inversion write enable signal to generate the read signal;

a first control signal generating circuit for generating the first control signal of high level in a flow through operation, and for generating the first control signal by receiving and delaying by 1 cycle the read signal in response to a inversion clock signal in a pipeline operation; and a first delay circuit for delaying the first control signal to generate the clock control signal.

3. The circuit of claim 2, wherein the read signal generating circuit comprises:

a first NAND gate for NANDing the read enable signal and the deselect inversion write enable signal to generate a first signal; and a first inverter for inverting the first signal to generate the read signal.

4. The circuit of claim 2, wherein the first control generating circuit comprises:

a first clock synchronous latch for receiving and latching a signal inverted from the read signal in response to the inversion clock signal;

a second NAND gate for inverting and outputting a signal latched by the first clock synchronous latch in response to the inverted clock signal;

a third NAND gate for generating a high level of signal when the inverted write pass through signal is at a low level, and for inverting and outputting the output signal of the second NAND gate when at a high level; and a first dynamic driver for generating the first control signal of high level in a flow through operation, and for generating a low level of the first control signal when the output signal of the third NAND gate is at a low level, and for generating the first control signal to be shifted to a low level in a predetermined time after being shifted to a high level when the output signal of the third NAND gate is shifted to a high level, in a pipeline operation.

5. The circuit of claim 4, wherein the first clock synchronous latch comprises:

a first transmission gate for transmitting a signal inverted from the read signal in response to the inversion clock signal of high level; and a first latch for latching the output signal of the first transmission gate to output it.

6. The circuit of claim 1, wherein the second control signal generating circuit comprises:

a first NOR gate for generating a low level of signal in a flow through operation, and for inverting and outputting the output signal of the first NAND gate in a pipeline operation;

a first register for delaying by 1 cycle and outputting the output signal of the first NOR gate in response to the clock signal;

a first AND gate for ANDing the output signal of the first NAND gate and the output signal of the first register to thereby generate a second signal for controlling a shift from a low impedance to a high impedance;

a second clock synchronous latch for receiving and latching the second signal in response to the inversion clock signal;

a second NOR gate for inverting and outputting the output signal of the clock synchronous latch in response to the inversion clock signal of low level; and a second dynamic driver for generating a low level of signal in case the output signal of the second NOR gate is at a low level, and for generating the second control signal being shifting to a low level in a predetermined time after being shifted to a high level when the output signal of the NOR gate is shifted to a high level.

7. The circuit of claim 6, wherein the first register comprises:

a first clocked CMOS inverter for inverting the output signal of the first NOR gate in response to the clock signal of low level;

a second latch for latching the output signal of the first clocked CMOS inverter;

a second clocked CMOS inverter for inverting the output signal of the second latch in response to the clock signal of high level; and a third latch for latching the output signal of the second clocked CMOS inverter.

8. The circuit of claim 6, wherein the second clock synchronous latch comprises:

a second transmission gate for transmitting the second signal in response to the inversion clock signal of high level; and a fourth latch for latching the output signal of the second transmission gate to output it.

9. The circuit of claim 1, wherein the write pass through signal generating circuit comprises:

a second inverter for inverting the deselect inversion write enable signal;

a third NOR gate for NORing the read enable signal and the output signal of the second inverter to thereafter detect a write command;

a second register for generating an output signal of low level in a flow through operation, and delaying by 1 cycle and inverting the output signal of the third NOR gate in response to the clock signal to output it;

a fourth NOR gate for NORing the output signal of the first NAND gate and the output signal of the second register to generate a write pass through signal; and a fourth NAND gate for inverting the output signal of the fourth NOR gate in response to the clock signal to generate a signal inverted from the write pass through signal.

10. The circuit of claim 9, wherein the second register comprises:

a third clocked CMOS inverter for inverting the output signal of the third NOR gate in response to the clock signal of low level;

a fifth latch for latching the output signal of the third clocked CMOS inverter;

a fifth NOR gate for generating the output signal of low level in a flow through operation and inverting and outputting the output signal of the fifth latch in a pipeline operation;

a fourth clocked CMOS inverter for inverting the output signal of the fifth NOR gate in response to the clock signal of high level; and a sixth latch for latching the output signal of the fourth clocked CMOS inverter.

11. The circuit of claim 1, wherein the third control signal generating circuit comprises:

a fifth NAND gate for inverting and outputting the second signal in response to the clock signal of high level;

a sixth NOR gate for generating a low level of signal when a double cycle deselect function is performed, and for inverting and outputting the output signal of the fifth NAND gate when a single cycle deselect function is performed; and a third dynamic driver for generating the third control signal of low level when the output signal of the sixth NOR gate is at a low level, and for generating the third control signal being shifted to a low level in a predetermined time after being shifted to a high level in case the output signal of the sixth NOR gate is at a high level.

12. The circuit of claim 1, wherein the output enable signal generating circuit comprises:

a pulling-up circuit connected between a power voltage and common node for pulling up the common node in response to a combination of the first control signal and the third control signal;

a pulling-down circuit connected between the common node and a ground voltage for pulling down the common node in response to one of the second control signal and the third control signal;

a sixth latch for latching a signal outputted through the common node; and a second AND gate for generating the output enable signal in response to the output enable control signal generated by a read command in a flow through operation, by outputting a signal latched by the common node by the sixth latch in a pipeline operation.

* * * * *

UNITED STATES PATENT AND TRADEMARK OFFICE
CERTIFICATE OF CORRECTION

PATENT NO. : 6,192,005 B1
DATED : February 20, 2001
INVENTOR(S) : Young-Dae Lee

It is certified that error appears in the above-identified patent and that said Letters Patent is hereby corrected as shown below:

Column 1,
Line 57, "generating chairmen" should be -- generating channel --

Column 2,
Line 47, "stricture" should be -- structure --.

Column 3,
Line 60, "output driver 16" should be -- output driver I6 --.

Column 4,
Line 31, "stricture" should be -- structure --.
Line 61, "113" should be -- I13 --.

Column 7,
Line 19, "tuned on" should be -- turned-on --.

Column 8,
Line 2, "a flout" should be -- a flow --.

Column 10,
Lines 28, 33 and 36, "134" should be -- I34 --.

Column 11,
Line 30, "alter" should be -- after --.

Column 12,
Line 55, "NORS" should be -- NOR8 --.

UNITED STATES PATENT AND TRADEMARK OFFICE
CERTIFICATE OF CORRECTION

PATENT NO. : 6,192,005 B1
DATED : February 20, 2001
INVENTOR(S) : Young-Dae Lee

It is certified that error appears in the above-identified patent and that said Letters Patent is hereby corrected as shown below:

Column 13,
Line 25, "arc" should be -- are --.

Signed and Sealed this

Seventeenth Day of September, 2002

Attest:

JAMES E. ROGAN
Attesting Officer
Director of the United States Patent and Trademark Office